(12) United States Patent
Ohashi

(10) Patent No.: US 11,432,450 B2
(45) Date of Patent: Aug. 30, 2022

(54) COMPONENT DETERMINATION SYSTEM AND COMPONENT DETERMINATION METHOD

(71) Applicant: FUJI CORPORATION, Chiryu (JP)

(72) Inventor: Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 389 days.

(21) Appl. No.: 16/614,456

(22) PCT Filed: Jun. 7, 2017

(86) PCT No.: PCT/JP2017/021049
§ 371 (c)(1),
(2) Date: Nov. 18, 2019

(87) PCT Pub. No.: WO2018/225168
PCT Pub. Date: Dec. 13, 2018

(65) Prior Publication Data
US 2020/0084928 A1  Mar. 12, 2020

(51) Int. Cl.
| H05K 13/08 | (2006.01) |
| H05K 3/00 | (2006.01) |
| H05K 13/04 | (2006.01) |

(52) U.S. Cl.
CPC ............ *H05K 13/08* (2013.01); *H05K 3/0008* (2013.01); *H05K 13/04* (2013.01); *H05K 2203/163* (2013.01)

(58) Field of Classification Search
CPC ...... H05K 13/08; H05K 3/0008; H05K 13/04; H05K 2203/163; H05K 1/0266;
(Continued)

(56) References Cited

U.S. PATENT DOCUMENTS

| 2010/0325860 A1 | 12/2010 | Maenishi |
| 2013/0125391 A1* | 5/2013 | Ishida ............... H05K 13/0411 29/832 |

FOREIGN PATENT DOCUMENTS

| JP | 10-150295 A | 6/1998 |
| JP | 2011-165946 A | 8/2011 |
| JP | 2011165946 | * 8/2011 |

OTHER PUBLICATIONS

International Search Report dated Aug. 29, 2017 in PCT/JP2017/021049 filed on Jun. 7, 2017.

* cited by examiner

*Primary Examiner* — Farhana A Hoque
(74) *Attorney, Agent, or Firm* — Oblon, McClelland, Maier & Neustadt, L.L.P.

(57) ABSTRACT

A component determination system for determining, in a case when a first component to be mounted on a board by a first mounting operation and a second component mounted on the board by a second mounting operation have a particular corresponding relationship, whether a combination of the first component and the second component mounted is permissible, the component determination system including: a first characteristic information acquiring section configured to acquire first characteristic information of the first component for which the first mounting operation has been completed; a second characteristic information acquiring section configured to acquire second characteristic information of the second component prepared prior to the second mounting operation; and a combination determining section configured to determine whether to allow the combination of the first component and the second component based on the acquired first characteristic information and the acquired second characteristic information.

10 Claims, 4 Drawing Sheets

(58) Field of Classification Search
CPC ....... H05K 1/0295; H05K 2201/10545; H05K 13/0882; H05K 13/085
USPC .................................................. 324/763.01
See application file for complete search history.

COMPONENT DETERMINATION SYSTEM AND COMPONENT DETERMINATION METHOD

TECHNICAL FIELD

The present disclosure relates to a component mounter for manufacturing a double-sided mounting board by mounting electronic components (hereinafter referred to as components) on the top surface and the bottom surface of a board, in particular, to a determination of whether a combination of a component mounted on the top surface and a component mounted on the bottom surface is allowed.

BACKGROUND ART

Technology for mass production of circuit boards by performing various operations (hereinafter referred to as board operations) for mounting components on a board on which printed wiring has been applied has become widespread. Examples of board work machines for performing the board work include solder printers, component mounters, reflow ovens, and board inspection machines. It is common for these board work machines to be connected to form board work lines. Component mounters generally include: a board conveyance device; component supply devices; and a component transfer device. Among boards on which component mounters perform mounting operation are double-sided mounting boards on which components are mounted on the top and bottom sides. Patent literature 1 discloses an example of technology related to double-sided mounting boards.

With a component mounting method of patent literature 1, after components are mounted on the top side of the board, the board is flipped and components are mounted on the bottom side of the board, thereby producing a double-sided mounting board in which there is a circuit pattern on the top and bottom sides of the board and the top and bottom sides of the board are the same. Accordingly, it is possible to curtail lost processing time and lost changeover time during board type changeover work, realizing an improvement in production efficiency.

CITATION LIST

Patent Literature

Patent literature 1: JP-A-H10-150295

BRIEF SUMMARY

Technical Problem

However, in patent literature 1, the same types of components are mounted on the top side and the bottom side of the board. Typically, components of the same type are interchangeable. When the attributes of two interchangeable parts are compared, there are various cases, such as a case where the manufacturers are different, a case where the manufacturers are the same but the lots are different, a case where the packaging holding multiple components are different even though the lots are the same, and a case where even the packaging is the same. In this specification, information representing attributes that may differ among interchangeable components is referred to as characteristic information. Characteristic information includes a manufacturer, a lot number, a packaging identification number, and an individual identification number.

When a double-sided board of patent literature 1 having the same top and bottom side is produced, if the characteristic information of the components mounted on the top and bottom side is the same, the circuit pattern characteristics of the top and bottom sides are the same, and the good quality of the board is ensured. On the contrary, if the characteristic information of the components on the top and bottom sides are different from each other, a difference occurs in the characteristics of the circuit pattern on the top side and the bottom side, and the quality of the board is lowered. For example, variation in the resistance value of a resistor component is generally small within the same lot and large between different lots. Therefore, by mounting resistor components from the same lot on the top side and the bottom side of a double-sided mounting board, it is possible to secure good board quality.

Further, there are also double-sided boards configured such that a specified portion of an electronic circuit is formed across the top side and the bottom side. With this type of double-sided mounting board, if the combination of the characteristic information of the top side components and the characteristic information of the bottom side components that constitute the specified portion are not managed, the performance of the specified portion is degraded, and the quality of the board is lowered.

With patent literature 1, the characteristic information of the components mounted on the top side and the bottom side surface is not managed, so there is a fear that the quality of the board may be lowered. Further, it is complicated to manually manage the characteristic information of components, and errors are likely to occur. In particular, in recent years, there has been a trend toward high-mix, low-volume production, and a lot of effort is required to manage characteristic information.

It is an object of the present disclosure to provide a component determination method and a component determination system that ensure good board quality by managing a combination of characteristic information of multiple components when multiple components having a particular corresponding relationship are mounted on the top side and the bottom side of a board.

Solution to Problem

Disclosed herein is a component determination system for determining, in a case when a first component to be mounted on a first side of a board by a first mounting operation and a second component mounted on the second side of the board by a second mounting operation have a particular corresponding relationship, whether a combination of the first component and the second component mounted is permissible, the component determination system including: a first characteristic information acquiring section configured to acquire first characteristic information of the first component for which the first mounting operation has been completed; a second characteristic information acquiring section configured to acquire second characteristic information of the second component prepared prior to the second mounting operation; and a combination determining section configured to determine whether to allow the combination of the first component and the second component based on the acquired first characteristic information and the acquired second characteristic information.

Also disclosed herein is a component determination method for determining, in a case when a first component to be mounted on a first side of a board by a first mounting operation and a second component mounted on the second side of the board by a second mounting operation have a particular corresponding relationship, whether a combination of the first component and the second component mounted is permissible, the component determination method including: acquiring first characteristic information of the first component for which the first mounting operation has been completed; acquiring second characteristic information of the second component prepared prior to the second mounting operation; and determining whether to allow the combination of the first component and the second component based on the acquired first characteristic information and the acquired second characteristic information.

Advantageous Effects

With a component determination system and a component determination method of the present disclosure it is determined whether to allow a combination of a first component and a second component based on: first characteristic information of a first component mounted on a first side of a board; and second characteristic information of a second component mounted on a second side of a board. A first side refers to, out of a top and a bottom side, a side that is a target of a first mounting operation that has already been performed, and a second side refers to, out of the top side and the bottom side, a side that is a target of a second mounting operation that is to be performed.

Here, when the first component and the second component have a particular corresponding relationship, if the combination of the first characteristic information and the second characteristic information is not appropriate, there arises a worry that the quality of the board will be lowered. For this, with the component determination system and the component determination method, it is determined whether the combination of the first characteristic information and the second characteristic information is appropriate, and if it is appropriate, the combination of the first component and the second component is allowed. In other words, the appropriateness of the second component is determined in accordance with the execution state of the performed first mounting operation. As a result, since the second component is appropriately mounted in the second mounting operation, good quality of the board is ensured.

DESCRIPTION OF EMBODIMENTS

1. Overall Configuration of Component Mounter 1

Figure 1:
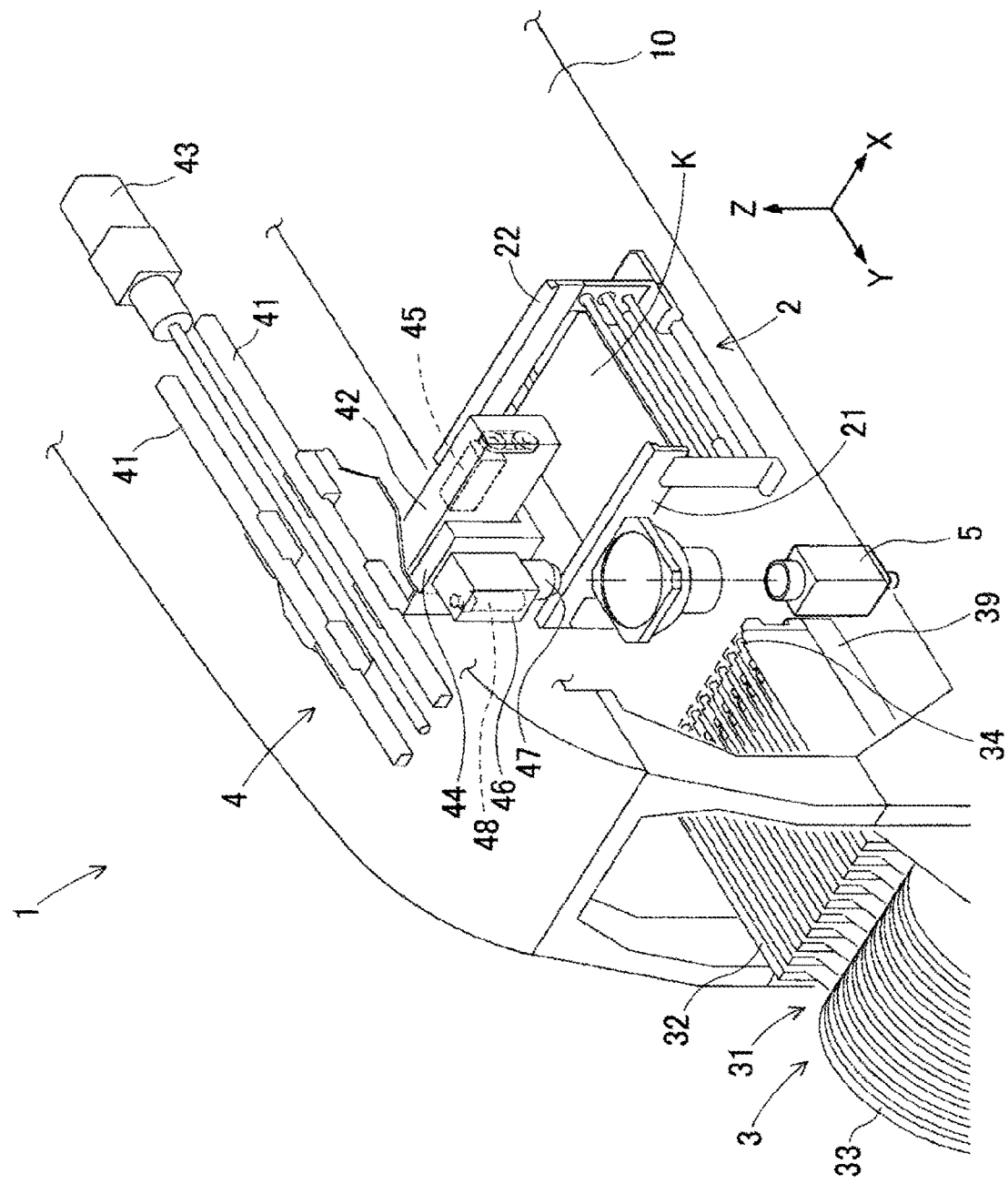
FIG. 1 is a perspective view of main sections that configure a component mounter that incorporates a component determination system of a first embodiment.

A component determination system of a first embodiment will be described with reference to FIGS. 1 to 4. FIG. 1 is a perspective view of main sections that configure component mounter 1 that incorporates component determination system 7 of a first embodiment. First, the overall configuration of component mounter 1 will be described. The direction from the upper left to the lower right in FIG. 1 is the X-axis direction in which board K is conveyed, and the direction from the upper right to the lower left is the Y-axis direction which is the front-rear direction of component mounter 1. Component mounter 1 includes items such as board conveyance device 2, component supply device 3, component transfer device 4, component camera 5, control section 6 (refer to FIG. 3), and machine base 10.

Board conveyance device 2 includes first guide rail 21 and second guide rail 22, a pair of conveyor belts, a clamp device, and the like. First guide rail 21 and second guide rail 22 are mounted on machine base 10 parallel to each other so as to extend in the X-direction across the upper center of machine base 10. A pair of conveyor belts arranged in parallel to each other are arranged directly below first guide rail 21 and second guide rail 22. The pair of conveyor belts revolve with board K in contact with the conveyance surface of the conveyor belts to load and unload board K to and from a mounting position set in a center section of machine base 10. Further, a clamp device is provided below the conveyor belts in the central portion of machine base 10. The clamp device pushes up board K with multiple pusher pins and clamps it horizontally to position it in the mounting position.

Component supply device 3 is detachably mounted on the front side of component mounter 1. Component supply device 3 includes feeder pallet 39 and multiple feeder devices 31. Feeder pallet 39 is a thin rectangular box-like member. Multiple slots extending in Y axis directions are provided in parallel on the upper surface of feeder pallet 39. The multiple feeder devices 31 are detachably inserted into and attached to respective slots.

Feeder device 31 includes: main body 32; supply reel 33 provided on the front side of main body 32; and component removal section 34 provided on an upper rear portion of main body 32. Carrier tape in which many components are sealed at a predetermined pitch is wound and held on supply reel 33. When the carrier tape is fed out at predetermined pitches, components are exposed from the encapsulated state and sequentially fed to component removal section 34. Each feeder device 31 memorizes a device code that identifies the individual device, and a component type code that identifies the type (component type) of the component being supplied. When attached to feeder pallet 39, feeder device 31 transmits the device code and the component type code to control section 6.

Feeder device 31 may memorize only component type codes and transmit them to control section 6. Further, feeder device 31 may store only device codes and transmit them to control section 6. With this system, combination information representing a corresponding relationship between the device code and the component type of feeder device 31 is registered in advance. Upon receiving the device code, control section 6 or host computer 8 (to be described later) compares the device code with the combination information, and recognizes the component type of the component supplied from the feeder device 31.

Component transfer device 4 includes items such as pair of Y-axis rails 41, Y-axis moving table 42, Y-axis motor 43, X-axis moving table 44, X-axis motor 45, mounting head 46, rotary tool 47, and Z-axis motor 48. The pair of Y-axis rails 41 is provided above the region from the rear section of machine base 10 to component supply device 3 at the front. Y-axis moving table 42 is loaded on pair of Y-axis rails 41.

Y-axis moving table 42 is moved in the Y-axis direction by the driving of Y-axis motor 43 via a ball screw mechanism. X-axis moving table 44 is loaded on Y-axis moving table 42. X-axis moving table 44 is moved in the X-axis direction by the driving of X-axis motor 45 via a ball screw mechanism.

Mounting head 46 is arranged on the front side of X-axis moving table 44. Mounting head 46 has rotary tool 47 on a lower side. Although omitted from FIG. 1, multiple suction nozzles are arranged in a ring on the lower side of rotary tool 47. The multiple suction nozzles are rotated at the lower side of rotary tool 47 to select one. The selected suction nozzle is raised and lowered by the driving of Z-axis motor 48. Further, the suction nozzle picks up a component by being supplied with negative pressure, and mounts the component on board K by being supplied with positive pressure. Mounting head 46 may include, but is not limited to, a clamping attachment for clamping a component.

Component transfer device 4 proceeds with mounting operations by repeating the pickup and mounting cycle. In detail, mounting head 46 of component transfer device 4 moves to component supply device 3 and picks up components with multiple suction nozzles. Next, upon mounting head 46 moving to component camera 5, the pickup states of the multiple components are imaged. Next, mounting head 46 moves to board K to mount the components, then returns to component supply device 3.

Component camera 5 is provided facing upwards on an upper surface of machine base 10 between board conveyance device 2 and component supply device 3. Component camera 5 captures an image of a state in which the multiple suction nozzles of mounting head 46 are moving to board K having picked up components from component removal section 34. As a result, component camera 5 can collectively image the components held by the multiple suction nozzles. The acquired image data is image processed, and the pickup state of the components is checked. When the pickup position of the component, deviation of the rotation angle, bending of leads, and the like have been checked, the mounting operation is finely adjusted as necessary. Components that are difficult to mount are discarded.

Control section 6 acquires job data corresponding to the board type of the board K to be produced next from host computer 8, which will be described later. Based on the acquired job data, control section 6 transmits various commands to board conveyance device 2, component supply device 3, component transfer device 4, and component camera 5 to control the execution of mounting operation. Control section 6 receives information on the operation status and the like from these devices.

The job data is data describing a detailed procedure and method for mounting operation. The job data is assigned with information of a board type code section specifying the type (board type) of the board K, and the job data is associated with the actual board K. Job data includes data such as the mounting order of the multiple components, the slot number of feeder pallet 39 indicating the supply position of each component, the type of suction nozzle used for the mounting operation, and operation control methods of mounting head 46.

In descriptions below, it is assumed that board K is a double-sided mounting board. Component mounter 1 performs mounting operations on the top side and the bottom side of board K. The order of work for the top side and the bottom side may be either first. Out of the top side and bottom side, the side that is the target for first mounting operation that is to be performed first is referred to as a first side. The side that is the target for second mounting operation that is to be performed subsequently, that is, the other of the top side and the bottom side surface, is referred to as a second side.

Board K is provided with a board code. The board code includes: a board type code section that identifies the board type, and an individual code section that identifies the board K individually. The board codes are barcodes or character strings, and are applied by printing or attaching labels. The top side and bottom side of board K are distinguished by the board codes. For example, a board code may be attached to only one of the top side and the bottom side, or different board codes may be attached to the top side and the bottom side.

2. Characteristic Information of Interchangeable Components

Figure 2:
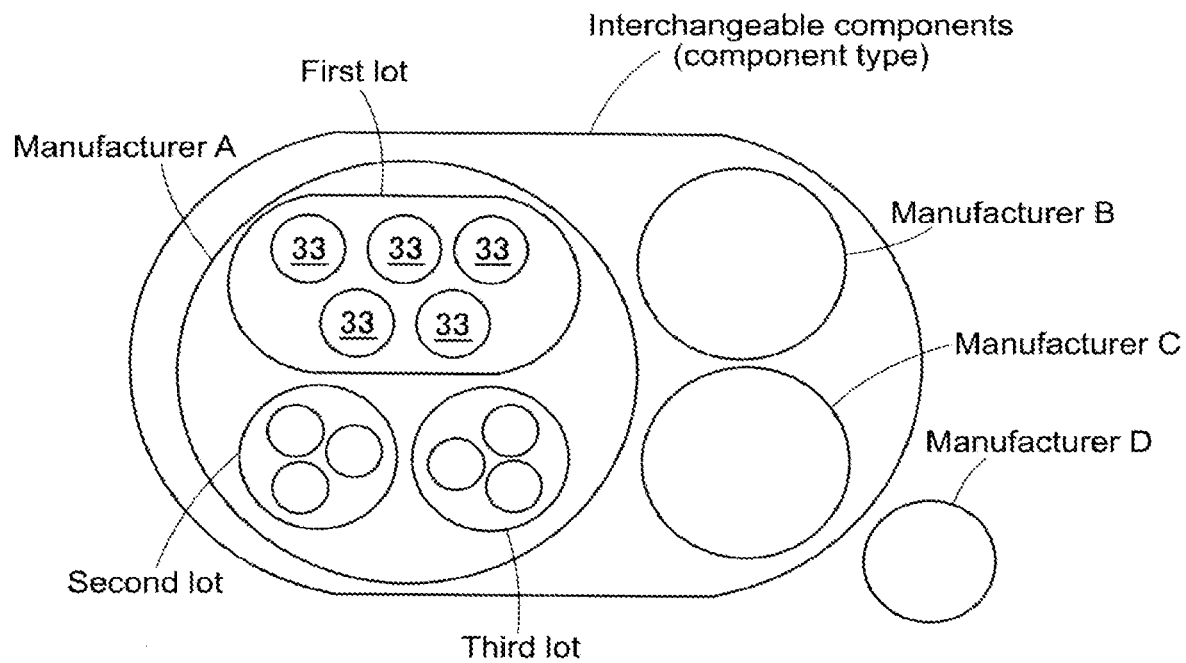
FIG. 2 illustrates characteristic information of interchangeable components and corresponding relationships thereof.

Next, characteristic information of interchangeable components will be described. Component determination system 7 functions when the first component mounted on the first side of board K by a first mounting operation and the second component mounted on the second side of board K by a second mounting operation have a particular corresponding relationship. In the first embodiment, the particular corresponding relationship is that the first component and the second component are the same component type. Components of the same component type are generally interchangeable components. FIG. 2 illustrates characteristic information of interchangeable components and corresponding relationships thereof.

The type of component (component type) is defined by items such as the shape, size, and electrical characteristic values of components as given by a standard. For example, a chip resistor component type is defined as having a resistance value of 1 k$\Omega$, and being rectangular with a longitudinal dimension of 0.4 mm, and a width dimension of 0.2 mm. As shown in FIG. 2, chip resistors are manufactured by manufacturer A, manufacturer B, and manufacturer C. Also, the chip resistors are procured from manufacturer A in lot units such as a first lot, a second lot, and so on. Each lot contains multiple holding packagings, that is, multiple supply reels 33.

A code for identifying the manufacturer and the lot number is attached to the lot. Supply reel 33 is assigned a code identifying the manufacturer, the lot number, and the packaging identification number. The manufacturer, the lot number, and the packaging identification number are characteristic information. In many cases, multiple pieces of characteristic information apply to interchangeable components. On the other hand, even if the characteristic information differs, interchangeable components may be considered the same type of component under the standard.

Further, the chip resistors of manufacturer D are treated as different component types even if they are the same under the standard. That is, the chip resistors of manufacturer D are not interchangeable with the chip resistors of manufacturer A, manufacturer B, or manufacturer C. For example, the chip resistors of manufacturer A, manufacturer B, and manufacturer C may have temperature dependent resistance values similar to each other within standard tolerances. On the other hand, even though within the tolerances, the chip resistors of manufacturer D may have specific temperature dependent resistance values. Therefore, the chip resistors of manufacturer D are considered to have a significant difference compared to the chip resistors of manufacturer A, manufacturer B, and manufacturer C, and are treated as a different component type.

Feeder device 31 attached to feeder pallet 39 recognizes the code attached to supply reel 33 and acquires the component type code and the characteristic information (the manufacturer, the lot number, and the packaging identification number). Further, feeder device 31 transmits the characteristic information together with the device code and the component type code to control section 6.

Note that, as described above, feeder device 31 may transmit the component type codes, and transmit the characteristic information together with the component type codes. Also, as described above, feeder device 31 may transmit the device codes. With this method, feeder device 31 does not have to acquire the characteristic information. Instead, combination information indicating the corresponding relationship between the characteristic information, the component type, and the device code of feeder device 31 is registered in advance. Upon receiving the device code, control section 6 or host computer 8 (to be described later) compares the device code with the combination information, and recognizes the component type and the characteristic information of the component supplied from the feeder device 31.

Note that, the holding packaging may be a tray containing multiple large components or a dicing sheet for holding multiple die components formed by dicing a semiconductor wafer. Multiple lots and multiple manufacturers are also conceivable for trays and dicing sheets. Even when the first component and the second component are supplied from a tray or a dicing sheet, component determination system 7 manages the combination of the characteristic information of the first component and the second component.

3. Functional Configuration of Component Determination System 7 of the First Embodiment Turning to a detailed description of component determination system 7 of the first embodiment. During mounting operation of a single-sided mounting board on which components are only mounted on a top side, component types are specified by job data, and applicable characteristic data is not specified. However, when board K is a double-sided mounting board, component determination system 7 manages the combination of the characteristic information of the first component and the second component, which are the same component types as each other.

Figure 3:
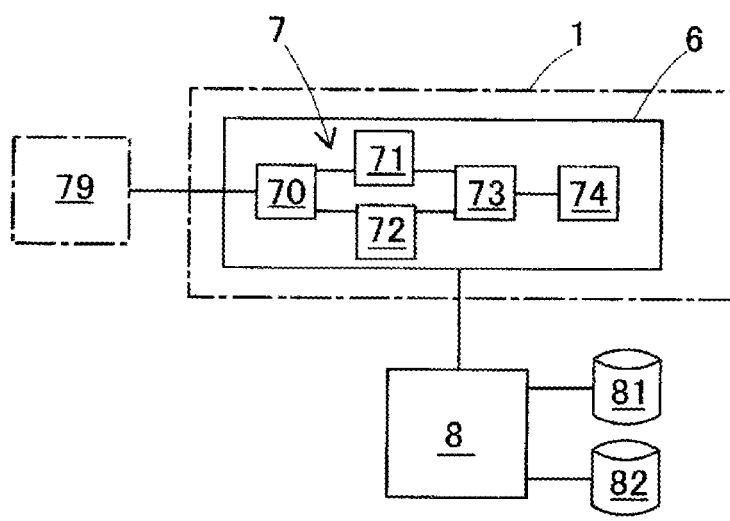
FIG. 3 is a block diagram showing the functional configuration of a component determination system of the first embodiment.

FIG. 3 is a block diagram showing the functional configuration of component determination system 7 of the first embodiment. Component determination system 7 is largely configured from control functions of control section 6. A portion of the functionality of host computer 8 is also included in component determination system 7. Component determination system 7 is not limited to the above division of functions, and may be configured using, for example, a computer device separate from control section 6.

Host computer 8 manages the entire board work line that includes component mounter 1. Host computer 8 can access job database 81 and operation history database 82. Job data of each board type is memorized in job database 81. In operation history database 82, the operation history of board operations performed at board work lines is transferred and recorded.

As shown in FIG. 3, component determination system 7 is configured from items such as board information acquiring section 70, first characteristic information acquiring section 71, second characteristic information acquiring section 72, combination determining section 73, and mounting prohibition section 74. Board information acquiring section 70 acquires the board codes of the boards K to be loaded. Examples of board information acquiring section 70 include a board information communication section or a board information imaging camera, which are not shown. A board information communication section receives a board code of board K from upstream device 79. A board imaging camera is arranged at the loading end of board conveyance device 2 and captures images of the board code attached to the board K.

First characteristic information acquiring section 71 acquires first characteristic information of a first component for which a first mounting operation has been completed. More specifically, first characteristic information acquiring section 71 acquires, from among multiple first characteristic information corresponding to the component type of the first component, specific first characteristic information of the first component that has already been mounted. That is, it is not possible to identify one of multiple first characteristic information corresponding to the first component before the first mounting operation has been performed. Based on the execution of the first mounting operation, the specific first characteristic information of the mounted first component is decided and then acquired.

Control section 6, when controlling the execution of the first mounting operation, receives the characteristic information directly from the feeder device 31 that supplies the first component. Alternatively, control section 6 indirectly recognizes the characteristic information by receiving the device code from the feeder device 31 and referencing with the combination information. Accordingly, first characteristic information acquiring section 71 is able to easily acquire specific first characteristic information. Further, first characteristic information acquiring section 71 associates the first characteristic information with the board code and sets it as operation history. This operation history is transferred from host computer 8 to operation history database 82 and recorded.

Second characteristic information acquiring section 72 acquires second characteristic information of a second component prepared prior to a second mounting operation. That is, second characteristic information acquiring section 72 acquires, from among multiple second characteristic information corresponding to the component type of the second component, specific second characteristic information of the second component that has been prepared. The second component that has been prepared refers to the feeder device 31 that supplies the second component being attached to feeder pallet 39. Control section 6 receives the characteristic information directly from the feeder device 31. Alternatively, control section 6 indirectly recognizes the characteristic information by receiving the device code from the feeder device 31 and referencing with the combination information. Accordingly, second characteristic information acquiring section 71 is able to easily acquire specific second characteristic information.

Combination determining section 73 performs a determination for each individual board K specified by the board codes. More specifically, combination determining section 73 determines whether to allow the combination of the first component and the second component based on the acquired first characteristic information and the acquired second characteristic information. That is, combination determining section 73 allows the combination of the first component and the second component when the specific first characteristic information acquired by the first characteristic information acquiring section 71 matches the specific second characteristic information acquired by the second characteristic information acquiring section 72. Mounting prohibition section 74 prohibits the second mounting operation when the combination determining section 73 does not allow the combination of the first component and the second component.

Figure 4:
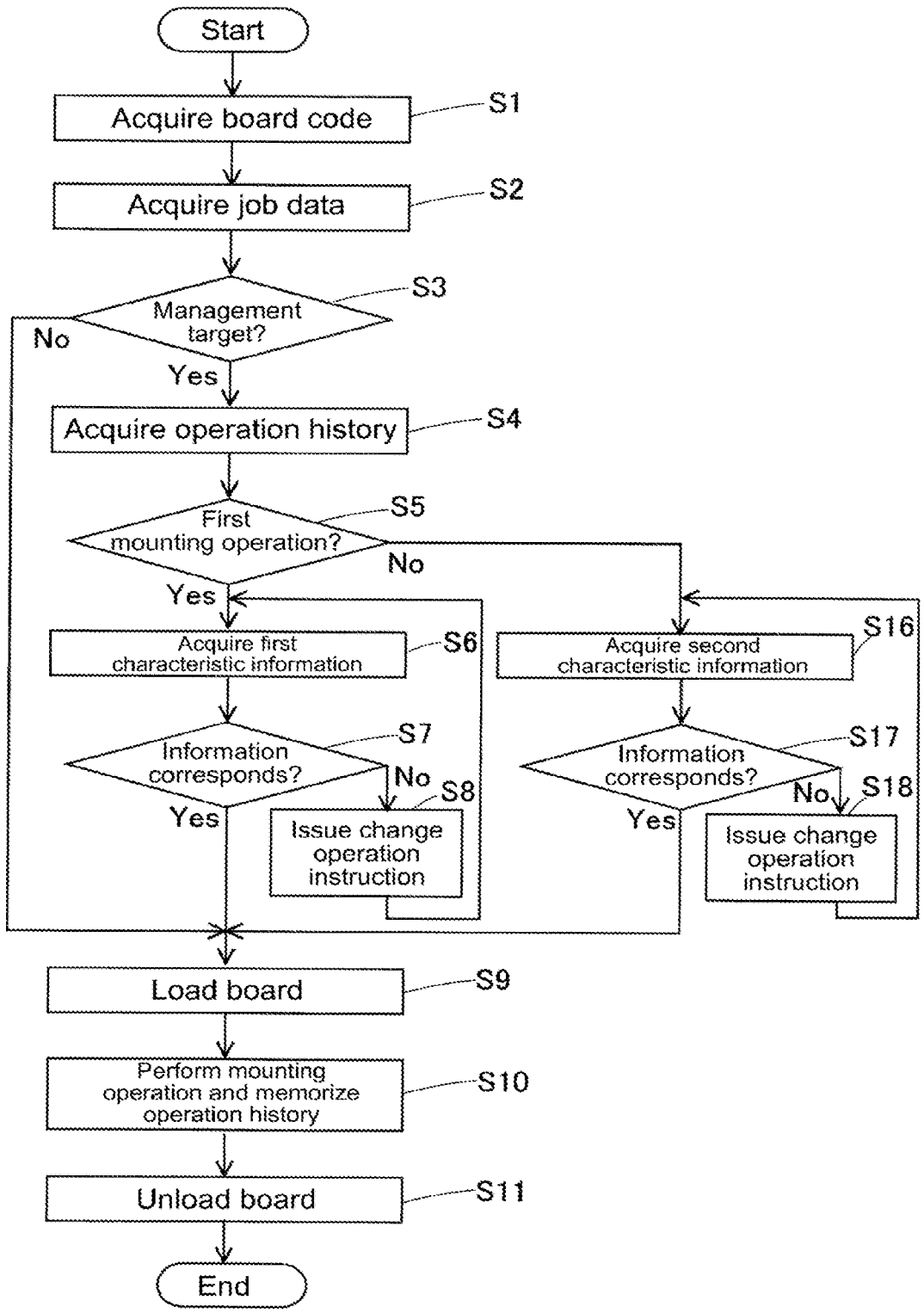
FIG. 4 is a flowchart showing an operation flow of the component determination system according to the first embodiment.

4. Operation and Effects of Component Determination System 7 of the First Embodiment Next, operation and effects of component determination system 7 of the first embodiment will be described. FIG. 4 is a flowchart showing an operation flow of component determination system 7 according to the first embodiment. In the initial state of the operation flow, it is assumed that changeover work of multiple feeder devices 31 on component supply device 3 has been completed, and that board K is prepared at the loading end of board conveyance device 2. Different manufacturers are given as an example of characteristic information of the first component and the second component. Specifically, a case is considered in which manufacturer A, manufacturer B, and manufacturer C correspond to interchangeable components of a first component and a second component, and manufacturer D does not correspond to interchangeable components.

In step S1 of FIG. 4, board information acquiring section 70 acquires the board code of board K. In step S2, component determination system 7 acquires job data corresponding to the board type code portion of the acquired board code from job database 81 via host computer 8. In step S3, component determination system 7 refers to the job data to determine whether the board K corresponds to a management target for which characteristic information of the first component and the second component is to be managed. As in patent literature 1, even if the top and the bottom sides are not same, a board K that is a double-sided board for which the same component type is to be mounted on the top side and the bottom side is a management target.

Component determination system 7 advances the execution of the operation flow to step S9 if the board K is not a management target, and advances the execution of the operation flow to step S4 if the board K is a management target. In step S4, component determination system 7 acquires the operation history of the mounting operation performed on the board K from operation history database 82 via host computer 8.

In step S5, component determination system 7 refers to the operation history to determine whether the present mounting operation is the first mounting operation. If there is no operation history related to board K, this is the first mounting operation. If there is an operation history of first mounting operation related to board K, this time is the second mounting operation. The operation history of the first mounting operation is recorded in the operation history database 82 in step S10 described later.

First characteristic information acquiring section 71 acquires the first characteristic information of the first component in step S6 when the first mounting operation is the current operation being performed. More specifically, first, first characteristic data acquiring section 71 acquires the specified slot number corresponding to the first component from the job data. First characteristic information acquiring section 71 then obtains the component type codes and the first characteristic information directly or indirectly from feeder device 31 arranged at the position of the specified slot number. In step S7, component determination system 7 determines whether the acquired first characteristic information corresponds to the first component.

In a case in which the first characteristic information is manufacturer D, the first characteristic information does not correspond to the first component. In addition, it cannot be guaranteed that the component type code itself is always correct. In such a case, component determination system 7 branches in the operation flow to step S8. In step S8, component determination system 7 prohibits the first mounting operation and issues an instruction for a change operation to change to the correct first component. Component determination system 7 displays, for example, "The first component should be a suitable manufacturer A, manufacturer B, or manufacturer C." The operator who sees this display responds by exchanging the feeder device 31 of the specified slot number or by exchanging supply reel 33. On the other hand, after the display, component determination system 7 returns the execution of the operation flow to step S6.

In step S7, if the first characteristic information is one of the A manufacturer, the B manufacturer, and the C manufacturer, the first unique information corresponds to the first component. Here, it is assumed that the first characteristic information is the B manufacturer. If they correspond, component determination system 7 advances the operation flow to step S9. In step S9, component determination system 7 allows board K to be loaded. Accordingly, control section 6 loads and positions board K.

In step S10, control section 6 performs a first mounting operation of the first component. Further, control section 6 performs mounting operations for other components on the first side. When mounting operations are completed, first characteristic information acquiring section 71 associates the first characteristic information, that is, manufacturer B of the mounted first component, with the board code of the board K as the operation history of the first mounting operation. This operation history is transferred to and recorded in operation history database 82. In step S11, control section 6 unloads board K, and the operation flow related to the first mounting operation ends.

On the other hand, when the current operation is the second mounting operation in step S5, component determination system 7 branches the execution of the operation flow to step S16. In step S16, second characteristic information acquiring section 72 acquires the second characteristic information of the second component. More specifically, first, second characteristic information acquiring section 72 acquires the specified slot number corresponding to the second component from the job data. Second characteristic information acquiring section 72 then obtains the component type code and the first characteristic information directly or indirectly from feeder device 31 arranged at the position of the specified slot number. In step S17, combination determining section 73 determines whether the acquired second characteristic information matches the first characteristic information recorded in the operation history for each board K specified by the board codes.

Here, as described above, the fact that the first characteristic information is manufacturer B is recorded in the operation history. If the second characteristic information was manufacturer A or manufacturer C, the second characteristic information would not match the first characteristic information even if the second characteristic information matched the second component. Therefore, combination determining section 73 branches the execution of the operation flow to step S18.

In step S18, mounting prohibition section 74 prohibits the second mounting operation and issues an instruction for the change operation to change to the correct second component. Mounting prohibition section 74 displays, for example, "Make the second component manufacturer B, the same as the first component." The operator who sees this display responds by exchanging the feeder device 31 of the specified slot number or by exchanging supply reel 33. On the other hand, after the display, mounting prohibition unit 74 returns the execution of the operation flow to step S16.

In step S17, when the second characteristic information is manufacturer B, the second characteristic information matches the first characteristic information. Accordingly, combination determining section 73 makes the operation flow merge into step S9. In step S9, component determination system 7 allows board K to be loaded. Accordingly, control section 6 loads and positions board K.

In step S10, control section 6 performs a second mounting operation of the second component. Further, control section 6 performs mounting operations for other components on the second side. When mounting operations are completed, second characteristic information acquiring section 72 associates the second characteristic information, that is, manufacturer B of the mounted second component, with the board code of the board K as the operation history of the second mounting operation. This operation history is transferred to and recorded in operation history database 82. Recording the operation history of the first mounting operation and the second mounting operation facilitates a subsequent follow-up survey. In other words, the traceability functionality is enhanced. In step S11, control section 6 unloads board K, and the operation flow related to the second mounting operation ends.

In the first embodiment, the particular corresponding relationship is that the first component of the first side of board K and the second component of the second side of board K are the same component type. On the other hand, component determination system 7 automatically matches the manufacturers of the first component and the second component, which is the characteristic information. That is, the second characteristic information (manufacturer B) of the second component to be mounted is limited in accordance with the first characteristic information (manufacturer B) of the first component mounted in the first mounting operation.

Generally, one large electronic circuit is formed on the top side and the bottom side of a board K, or separate electronic circuits related to each other are formed. That is, the first component and the second component are related to each other in terms of the characteristics of the electronic circuit. Therefore, by matching the characteristic information of the first component and the characteristic information of the second component, the characteristics of the electronic circuits are improved, and good quality of the board K is ensured.

5. Component Determination System 7A of a Second Embodiment

Figure 5:
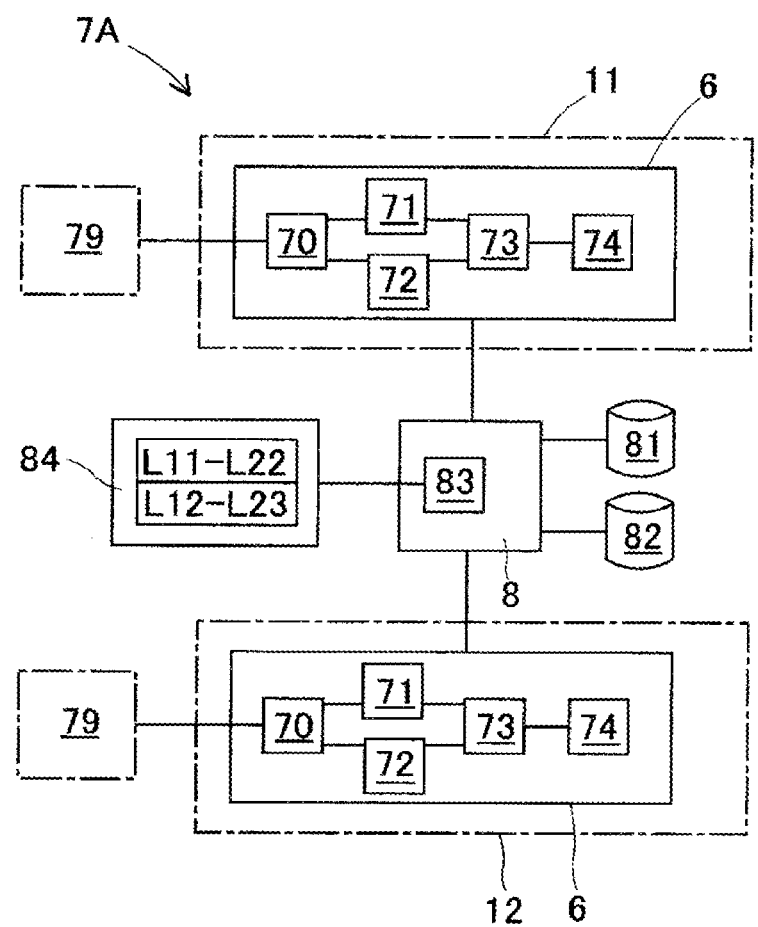
FIG. 5 is a block diagram showing a functional configuration of a component determination system according to a second embodiment.

Next, component determination system 7A of a second embodiment is described, mainly by describing differences to the first embodiment. Component determination system 7A of the second embodiment is configured to straddle first component mounter 11 and second component mounter 12. FIG. 5 is a block diagram showing a functional configuration of component determination system 7A according to a second embodiment. Host computer 8, job database 81, and operation history database 82 are shared by first component mounter 11 and second component mounter 12.

As shown in FIG. 5, control section 6 of first component mounter 11 is provided with board information acquiring section 70, first characteristic information acquiring section 71, second characteristic information acquiring section 72, combination determining section 73, and mounting prohibition section 74, which constitute component determination system 7A. Similarly, control section 6 of second component mounter 12 is also provided with board information acquiring section 70, first characteristic information acquiring section 71, second characteristic information acquiring section 72, combination determining section 73, and mounting prohibition unit 74, which constitute component determination system 7A. According to component determination system 7A of the second embodiment, even if the component mounter for performing the first mounting operation and the component mounter for performing the second mounting operation are different, the same operation and effects as those of the first embodiment can be performed.

Further, component determination system 7A of the second embodiment also functions when a specified portion of the electronic circuit formed in the board is composed of a combination of the first component and the second component. For example, consider the case where the first component is a crystal oscillator and the second component is an adjustment resistor. The resistance value of the adjustment resistor enables fine adjustment of the oscillation frequency output from the crystal oscillator. In this case, by managing the combination of the first characteristic information of the crystal oscillator and the second characteristic information of the adjustment resistor, an effect of reducing the variation of the oscillation frequency can be expected. There are many other examples of circuit configurations in which the characteristics of the electronic circuit can be improved by managing the combination of the first characteristic information and the second characteristic information.

In order to achieve the advantages of good performance of an electronic circuit, combination memory section 83 is provided in host computer 8. Combination memory section 83 is a portion of component determination system 7A. Combination memory section 83 stores an allowable combination of the first characteristic information and the second characteristic information in advance in memory 84. Memory 84 is a portion of combination memory section 83. An example is described below with the lot number as the characteristic information of the first component and the second component.

Allowable combinations are found, for example, by advances combination compatibility tests. In the combination compatibility tests, sample components from each lot of the first component and the second component are combined to form a test-use electronic circuit. Characteristics of the test-use electronic circuit are measured to determine whether the compatibility is acceptable. As a result, combinations of lots with good compatibility are allowed and stored as such by combination memory section 83. In the example of FIG. 5, a combination of eleventh lot number L11 of the first component and twenty-second lot number L22 of the second component, and a combination of twelfth lot number L12 of the first component and twenty-third lot number L23 of the second component are stored in memory 84.

When the stored combinations are used to determine the combination of the first component and the second component, component determination system 7A performs an operation flow similar to the operation flow of FIG. 4. Actually, the board information acquiring section 70, first characteristic information acquiring section 71, second characteristic information acquiring section 72, combination determining section 73, and mounting prohibition section 74 of the component mounter (11, 12) in which the board is prepared to be loaded perform the operations. Further, operation contents of steps S7, S17, and so on are changed.

In step S7, first characteristic information acquiring section 71 determines whether the lot number of the first component acquired in step S6 is stored in combination memory section 83. That is, first characteristic data acquiring section 71 determines whether the lot number of the first component matches either the eleventh lot number L11 or the twelfth lot number L12. Here, it is assumed that the lot number of the first component matches eleventh lot number L11. First characteristic information acquiring section 71 causes the operation flow to proceed to S9, and allows the board to be loaded. In step S10, operation history is recorded that the first component with the eleventh lot number L11 has been mounted.

In step S17, for each board specified by the board code, combination determining section 73 references the combination of the lot number of the second component acquired in step S16 and the eleventh lot number L11 of the first component recorded in the operation history with content stored in combination memory section 83. For example, when the lot number of the second part is the twenty-first lot number L21, the combination of eleventh lot number L11 and twenty-first lot number L21 is not stored in combination memory section 83. When referencing reveals a non-match in this manner, combination determining section 73 branches the execution of the operation flow to step S18.

Alternatively, for example, when the lot number of the second component is twenty-second lot number L22, the combination of eleventh lot number L11 and twenty-second lot number L22 is stored in combination memory section 83. When referencing reveals a match in this manner, combination determining section 73 merges the operation flow to step S9. In step S10, the second mounting operation is performed, and the second component of the twenty-second lot number L22 is mounted on the second side. As described above, the combinations of the characteristic information of the first component and the characteristic information of the second component are limited to the combinations stored by combination memory section 83.

In the second embodiment, the first component and the second component have a particular corresponding relationship that they are used in combination to constitute a particular portion of the electronic circuit formed on the board. With respect to this, component determination system 7A memorizes in advance combinations of the first characteristic information and the second characteristic information that result in an electronic circuit with good characteristics. Further, component determination system 7A limits the combination of the first characteristic information of the mounted first component and the second characteristic information of the second component to be mounted to be within the stored combinations. Therefore, the characteristics of the electronic circuit are good, and good quality of the board is ensured.

Applications and Variations of Embodiments

In the first embodiment, distinction between the manufacturer is used as the characteristic information, and in the second embodiment, the lot number is used as the characteristic information, but the present configuration is not limited thereto. For example, in the first embodiment, the lot number and the packaging ID number can be used as characteristic information, and the lot or supply reel 33 of the first component and the second component can be made to match each other. Further, for example, in the second embodiment, the individual ID number may be used as characteristic information, and good combinations of the first component and the second component may be found by advanced all-number combination compatibility tests and stored in combination memory section 83. Also, combination memory section 83 may be added to component determination system 7 of the first embodiment to enable component determination system 7 to perform the same operations as that of the second embodiment. Further, component determination systems 7 and 7A of the first and second embodiments may be implemented as component determination methods. The first and second embodiments may be applied with various other applications and modifications.

REFERENCE SIGNS LIST

1: component mounter;
11: first component mounter;
12: second component mounter;
2: board conveyance device;
3: component supply device;
31: feeder device;
4: component transfer device;
5: component camera
5: control section;
7, 7A: component determination system;
70: board information acquiring section;
71: first characteristic information acquiring section;
72: second characteristic information acquiring section;
73: combination determining section;
74: mounting prohibition section;
8: host computer;
81: job database;
82: work history database;
83: combination memory section;
K: substrate

The invention claimed is:

1. A component determination system for determining, in a case when a first component to be mounted on a first side of a board by a first mounting operation and a second component mounted on a second side of the board by a second mounting operation have a particular corresponding relationship, whether a combination of the first component and the second component mounted is permissible, the component determination system comprising:
  a board information acquiring section configured to acquire board information specifying at least one of a type of the board or an individual board itself;
  a first characteristic information acquiring section configured to acquire first characteristic information of the first component for which the first mounting operation has been completed, the first characteristic information acquiring section configured to acquire, among multiple pieces of the first characteristic information that apply to a component type of the first component, specific first characteristic information that is specific to a mounted first component, and further memorize the specific first characteristic information in association with the board information;
  a second characteristic information acquiring section configured to acquire second characteristic information of the second component prepared prior to the second mounting operation, the second characteristic information acquiring section configured to acquire, among multiple pieces of the second characteristic information that apply to a component type of the second component, specific second characteristic information that is specific to a prepared second component; and a combination determining section configured to determine whether to allow the combination of the first component and the second component based on the acquired first characteristic information and the acquired second characteristic information, the combination determining section configured to allow the combination of the first component and the second component when the specific first characteristic information matches the specific second characteristic information.

2. The component determination system according to claim 1, wherein
the particular corresponding relationship of the first component and the second component is that they are a same part type, and
the first characteristic information and the second characteristic information are at least one of a packaging identification number identifying a packaging that holds multiple of the components, a lot number identifying a lot of multiple of the packagings, or a manufacturer of the components.

3. The component determination system according to claim 1, further comprising:
a combination memory section configured to memorize in advance an allowable combination of the first characteristic information and the second characteristic information,
wherein
the combination determining section is configured to allow the combination of the first component and the second component when the combination of the acquired first characteristic information and the acquired second characteristic information is memorized in the combination memory section.

4. The component determination system according to claim 3, wherein
the particular corresponding relationship of the first component and the second component is that they are used in combination for configuring a specific portion of an electronic circuit formed on the board, and
the first characteristic information and the second characteristic information are at least one of an individual identification number identifying an individual component, a packaging identification number identifying a packaging that holds multiple of the components, a lot number identifying a lot of multiple of the packagings, or a manufacturer of the components.

5. The component determination system according to claim 1, further comprising:
a mounting prohibition section configured to prohibit the second mounting operation when the combination determining section does not allow the combination of the first component and the second component.

6. A component determination method for determining, in a case when a first component to be mounted on a first side of a board by a first mounting operation and a second component mounted on a second side of the board by a second mounting operation have a particular corresponding relationship, whether a combination of the first component and the second component mounted is permissible, the component determination method comprising:
acquiring board information specifying at least one of a type of the board or an individual board itself;
acquiring first characteristic information of the first component for which the first mounting operation has been completed;
acquiring, among multiple pieces of the first characteristic information that apply to a component type of the first component, specific first characteristic information that is specific to a mounted first component, and further memorize the specific first characteristic information in association with the board information;
acquiring second characteristic information of the second component prepared prior to the second mounting operation;
acquiring, among multiple pieces of the second characteristic information that apply to a component type of the second component, specific second characteristic information that is specific to a prepared second component;
determining whether to allow the combination of the first component and the second component based on the acquired first characteristic information and the acquired second characteristic information; and
allowing the combination of the first component and the second component when the specific first characteristic information matches the specific second characteristic information.

7. The component determination method according to claim 6, wherein
the particular corresponding relationship of the first component and the second component is that they are the same part type, and
the first characteristic information and the second characteristic information are at least one of a packaging identification number identifying a packaging that holds multiple of the components, a lot number identifying a lot of multiple of the packagings, or a manufacturer of the components.

8. The component determination method according to claim 6, further comprising:
memorizing in advance an allowable combination of the first characteristic information and the second characteristic information, and
allowing the combination of the first component and the second component when the combination of the acquired first characteristic information and the acquired second characteristic information is memorized in a combination memory section.

9. The component determination method according to claim 8, wherein
the particular corresponding relationship of the first component and the second component is that they are used in combination for configuring a specific portion of an electronic circuit formed on the board, and
the first characteristic information and the second characteristic information are at least one of an individual identification number identifying an individual component, a packaging identification number identifying a packaging that holds multiple of the components, a lot number identifying a lot of multiple of the packagings, or a manufacturer of the components.

10. The component determination method according to claim 6, further comprising:
prohibiting the second mounting operation when the combination of the first component and the second component is determined to not be allowed.

* * * * *